(12) United States Patent
Kim et al.

(10) Patent No.: US 9,671,700 B2
(45) Date of Patent: Jun. 6, 2017

(54) DIGITAL EXPOSURE DEVICE USING GLV AND DIGITAL EXPOSURE DEVICE USING DMD

(71) Applicant: Samsung Display Co., Ltd., Yongin (KR)

(72) Inventors: ChangHoon Kim, Asan-si (KR); JaeHyuk Chang, Seongnam-si (KR); Su-Yeon Sim, Seoul (KR); KiBeom Lee, Seoul (KR); HiKuk Lee, Yongin-si (KR); Sanghyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 385 days.

(21) Appl. No.: 14/017,921

(22) Filed: Sep. 4, 2013

(65) Prior Publication Data

US 2014/0300881 A1  Oct. 9, 2014

(30) Foreign Application Priority Data

Apr. 4, 2013  (KR) .................. 10-2013-0036884

(51) Int. Cl.
| | | |
|---|---|---|
| *G02B 5/18* | (2006.01) | |
| *G03B 27/32* | (2006.01) | |
| *G03B 27/54* | (2006.01) | |
| *G03B 27/72* | (2006.01) | |
| *G03F 7/20* | (2006.01) | |
| *G02B 26/08* | (2006.01) | |

(52) U.S. Cl.
CPC ..... *G03F 7/70291* (2013.01); *G02B 26/0808* (2013.01); *G03F 7/70275* (2013.01)

(58) Field of Classification Search
CPC  G02B 26/08; G02B 26/0808; G02B 26/0816; G02B 26/0833; G02B 26/0841; G02B 26/1828; G03F 7/2057; G03F 7/70291; G03F 7/70283; G03F 7/70508
USPC ........ 355/53, 67, 71, 77; 359/290, 291, 295, 359/298, 572, 573
See application file for complete search history.

(56) References Cited

U.S. PATENT DOCUMENTS

| | | | |
|---|---|---|---|
| 6,717,650 | B2 | 4/2004 | Jain |
| 6,898,377 | B1 | 5/2005 | LeHoty et al. |
| 7,268,856 | B2 | 9/2007 | Shirota et al. |
| 7,286,155 | B1 | 10/2007 | Trisnadi et al. |
| 7,440,078 | B2 | 10/2008 | Bleeker et al. |
| 7,508,570 | B1 | 3/2009 | Meisburger |

(Continued)

FOREIGN PATENT DOCUMENTS

| | | |
|---|---|---|
| JP | 2006-284842 | 10/2006 |
| JP | 2007-101607 | 4/2007 |

(Continued)

*Primary Examiner* — Colin Kreutzer
(74) *Attorney, Agent, or Firm* — H.C. Park & Associates, PLC

(57) ABSTRACT

A digital exposure device including a GLV or a DMD. The digital exposure device also includes: a stage to support and move a substrate in a scan direction; an optical system disposed between the stage and the GLV or the DMD, to form a pattern on the substrate by modulating light received from the GLV or the DMD; and a control unit to control the a width of the pattern by a unit, the unit being obtained by dividing the width of the pattern by a natural number m, in the second direction.

12 Claims, 13 Drawing Sheets

(56) References Cited

U.S. PATENT DOCUMENTS

| | | |
|---|---|---|
| 7,548,301 B2 | 6/2009 | Sewell |
| 7,548,315 B2 | 6/2009 | Van Horssen |
| 8,072,580 B2 | 12/2011 | Cha et al. |
| 8,259,285 B2 | 9/2012 | Troost et al. |
| 2004/0075882 A1* | 4/2004 | Meisburger ......... G03F 7/70216 359/290 |
| 2005/0012916 A1 | 1/2005 | Van Der Mast et al. |
| 2005/0134819 A1* | 6/2005 | de Jager ............ G03F 7/70275 355/55 |
| 2006/0232755 A1* | 10/2006 | Menon ................ G03F 7/70383 355/53 |
| 2009/0180091 A1 | 7/2009 | Farnsworth et al. |
| 2009/0219491 A1* | 9/2009 | Williams ........... G02B 27/0927 353/37 |
| 2009/0296170 A1 | 12/2009 | Sumi |
| 2010/0081072 A1 | 4/2010 | Iosad et al. |
| 2010/0208229 A1 | 8/2010 | Shin et al. |
| 2011/0188016 A1 | 8/2011 | De Jager et al. |
| 2011/0267594 A1 | 11/2011 | Kim et al. |
| 2012/0050705 A1 | 3/2012 | Washiyama et al. |
| 2013/0203001 A1* | 8/2013 | Wang ................... G03F 7/2022 430/296 |

FOREIGN PATENT DOCUMENTS

| | | |
|---|---|---|
| KR | 1020110073938 | 6/2011 |
| KR | 1020120097264 | 9/2012 |
| KR | 1020120100208 | 9/2012 |

\* cited by examiner

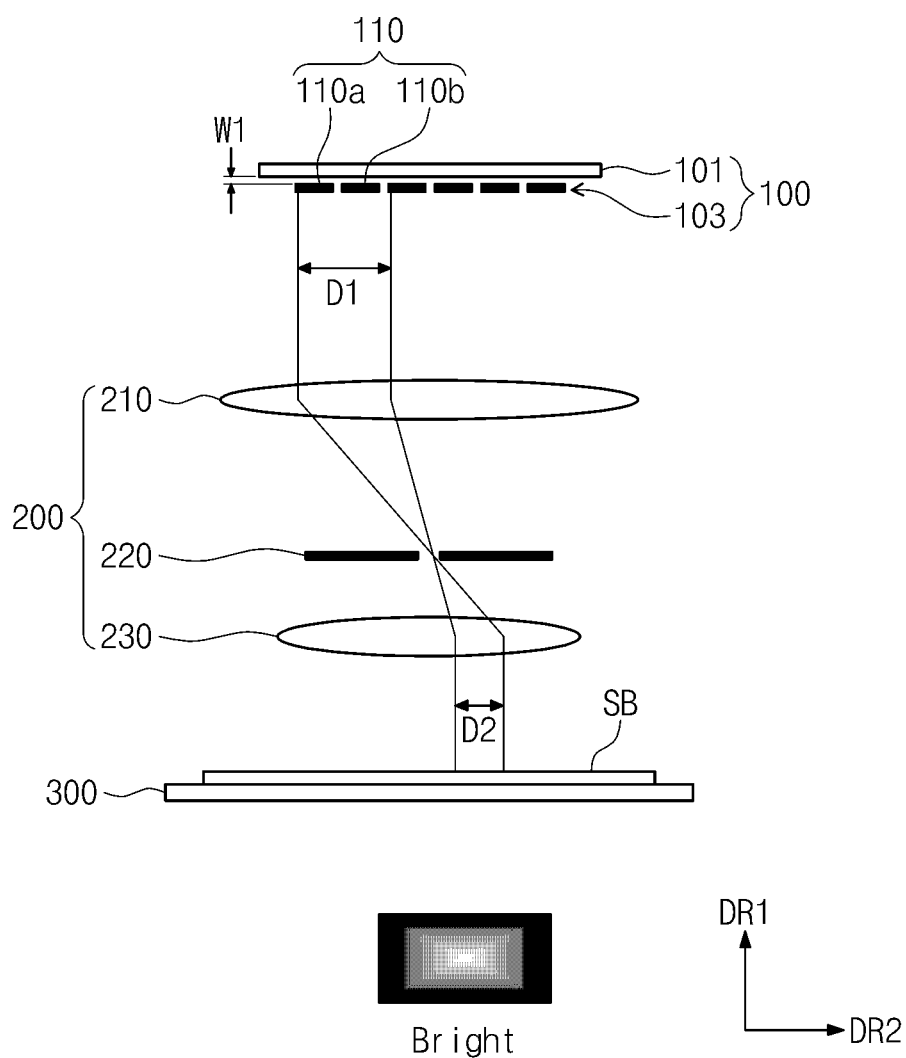

DIGITAL EXPOSURE DEVICE USING GLV AND DIGITAL EXPOSURE DEVICE USING DMD

CROSS-REFERENCE TO RELATED APPLICATION

This application claims priority from and the benefit of Korean Patent Application No. 10-2013-0036884, filed on Apr. 4, 2013, which is hereby incorporated by reference for all purposes as if fully set forth herein.

BACKGROUND

Field

Exemplary embodiments of the present invention relate to a digital exposure device using a grating light valve (GLV), and a digital exposure device using a digital micro-mirror device (DMD), which are capable of improving resolution.

Discussion of the Background

In general, according to a method of forming a pattern on a substrate configuring a liquid crystal display (LCD), a plasma display panel (PDP), or a flat panel display (FPD), a pattern material is applied to the substrate and is then selectively exposed using a photomask. Then the pattern is formed by selectively removing a pattern material portion having a changed chemical property, or other portions.

However, as substrates become larger and include smaller patterns, digital exposure devices for forming such patterns on a substrate, without a photomask, are being developed. Such a digital exposure device forms a pattern by transmitting a light beam onto a substrate with pattern information including electrical signals, by using an electronic device.

Such a digital exposure device may include a GLV or a DMD.

The digital exposure device including a GLV includes a GLV configured with one pair of ribbons and turns the GLV on/off through an optical interference phenomenon occurring when incident light is diffracted by a position difference between the two ribbons. In the digital exposure device including a DMD, a plurality of micro mirrors reflect a light, which is incident a predetermined angle, at a desired angle, and other light at a different angle, so that only selected light is exposed.

BRIEF SUMMARY OF THE INVENTION

Aspects of the present invention provide a digital exposure device including a grating light valve (GLV) capable of providing improved resolution.

Aspects of the present invention also provide a digital exposure device including a digital micro-mirror device (DMD) capable of forming a uniform pattern width and thickness for each head included therein.

Exemplary embodiments of the present invention provide a digital exposure device including: a stage to support a substrate and move the substrate in a scan direction; a GLV including a first ribbon and a second ribbon that are spaced apart from the stage in a first direction, extend in a second direction, and are configured to diffract light; an optical system disposed between the stage and the GLV in the first direction and configured to filter and focus the diffracted light, so as to form a pattern on the substrate; and a control unit configured to control a width of the pattern, taken in the second direction, by a unit obtained by dividing the second direction width of the pattern by a natural number m.

In other embodiments of the present invention, provided is a digital exposure including: a stage configured to support a substrate and move the substrate a scan direction; a first light source configured to generate a first light; a first head spaced apart from the stage in a first direction, and configured to generate beam spots on the substrate by modulating the first light; and a DMD control unit configured to adjust the sizes and energies of the beam spots to be a first average size and a first average energy.

In yet other embodiments of the present invention, provided is a digital exposure device including: a stage configured to support a substrate and move the substrate in a scan direction; a first light source configured to generate a first light; a second light source spaced apart from the first light source and configured to generate a second light; a first head spaced apart from the stage in a first direction, configured to generate first beam spots on the substrate by modulating the first light; a second head spaced apart from the first head, and configured to generate second beam spots on the substrate by modulating the second light; and a DMD control unit configured to control the first and second heads, such that the first beam spots have a first average size and a first average energy, and the second beam spots have a second average size and the first average energy.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention.

FIG. 2A is a view illustrating the digital exposure device operating the GLV in a bright state.

DETAILED DESCRIPTION OF THE ILLUSTRATED EMBODIMENTS

Figure 1:
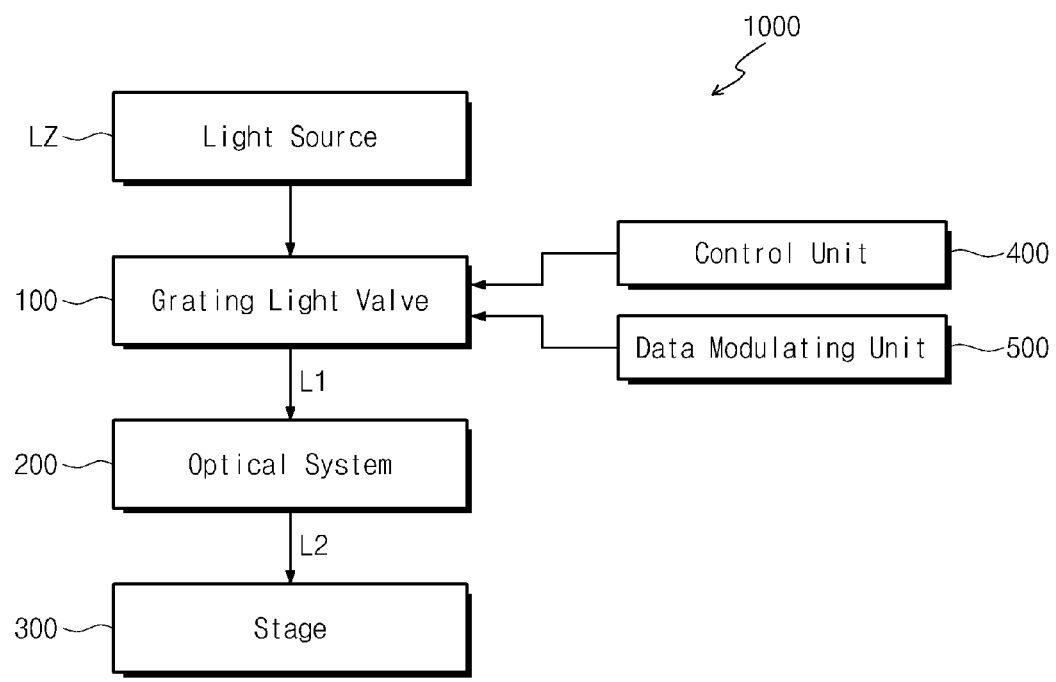
FIG. 1 is a block diagram of a digital exposure device including a GLV, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2B:
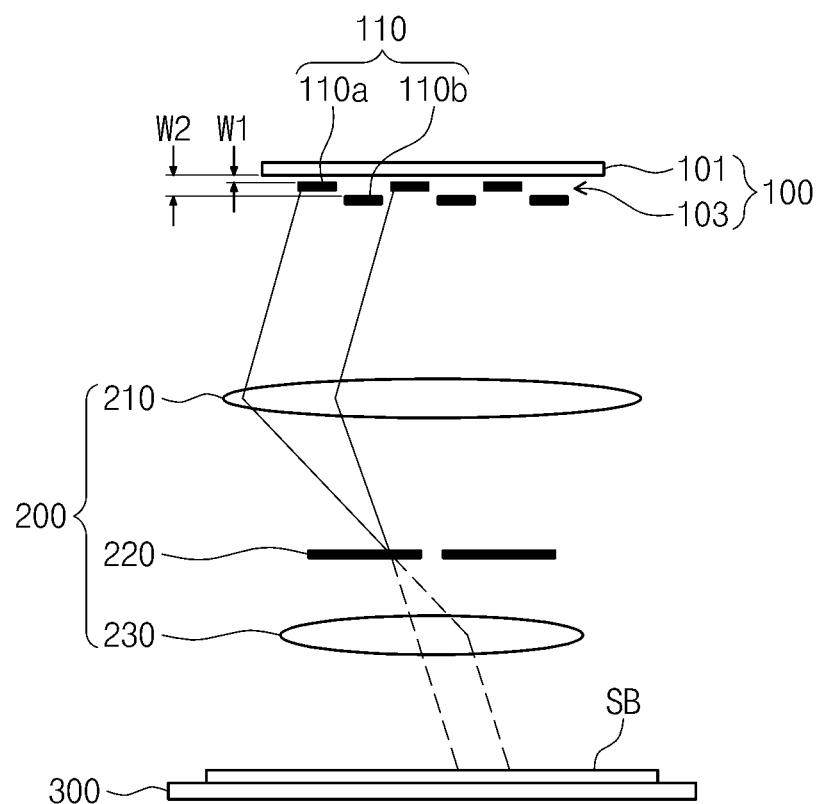
FIG. 2B is a view illustrating a digital exposure device operating the GLV in a dark state.

FIG. 1 is a block diagram illustrating a digital exposure device using a grating light valve 100 (GLV). FIG. 2A is a view illustrating the digital exposure device when the GLV 100 operates to produce a bright state. FIG. 2B is a view illustrating the digital exposure device when the GLV 100 operates to produce a dark state.

Referring to FIGS. 1, 2A, and 2B, the digital exposure device 1000 a light source LZ, the GLV 100, an optical system 200, a stage 300, a control unit 400, and a data modulation unit 500. The light source LZ serves to provide light to the GLV 100. Light emitted from the light source LZ may be laser light.

The GLV 100 includes a Micro Electro-Mechanical System (MEMS) and controls an optical diffraction state by transforming the position of the MEMS with electric power. The GLV 100 may include a metallic substrate 101 and a ribbon unit 103. The metallic substrate 101 may include a single or multiple metallic layers.

The ribbon unit 103 may include a plurality of ribbon pairs 110. One ribbon pair 110 may include at least a first ribbon 110a and a second ribbon 110b. Each of the first ribbon 110a and the second ribbon 110b may have a form extending in a scan direction orthogonal to a first direction DR1 and a second direction DR2. The first ribbon 110a and the second ribbon 110b are disposed adjacent to each other in the second direction DR2. Opposing ends of each of the first ribbon 110a and the second ribbon 110b may be fixed to the metallic substrate 101, in the scan direction. Central portions of each of the first ribbon 110a and the second ribbon 110b may be spaced apart from the metallic substrate 101, in the first direction DR1.

The GLV 100 reflects or diffracts incident light to provide a first light L1 to the optical system 200. The first light L1 includes light diffracted by each of the ribbon pairs 110. The first light L1 may include diffraction orders having a different brightness.

The optical system 200 receives and reduces the first light L1 to provide a second light L2 to a substrate SB disposed on the stage 300. The optical system 200 may include a first lens 210, a Fourier filter 220, and a second lens 230. The first lens 210, the Fourier filter 220, and the second lens 230 may be sequentially spaced apart from each other, between the GLV 100 and the stage 300.

The first lens 210 focuses the first light on the Fourier filter 220. The Fourier filter 220 may filter and/or diffract the first light received from the first lens 210. The Fourier filter 220 filters the first light, such that it transmits only light of a diffraction order having the largest brightness (for example, a zeroth order) among the first light received from the first lens 210 may be transmitted therethrough. The second lens 230 focuses the first light that passes through the Fourier filter 220 onto the substrate SB.

The optical system 200 may generate the second light L2 by reducing the width of the first light L1, in the second direction DR2, by 1/n. That is, when the width of the first light L1 diffracted by the ribbon pair 110 in the second direction DR2 is defined as a first width D1, and the width of the second light L2 in the second direction DR2 is defined as a second width D2, the second width D2 becomes 1/n of the first width D1. In the case that n is 10, when the width of each of the first ribbon 110a and the second ribbon 110b in the second direction DR1 is 2.5, the first width D1 is 5 μm. Since the first light L1 is reduced to 1/10 in the second direction DR2 by passing the optical system 200, the second width D2 becomes 0.5 μm.

Since the second light L2 is incident to the substrate SB, a minimum unit of a pattern formed on the substrate SB may be the second width D2. Since there may be limitations in reducing the width of the first ribbon 110a and the second ribbon 110b in the second direction DR2, and in a reduction ratio of the optical system 200, it may be difficult to form a pattern smaller than the second width D2, on the substrate SB.

The stage 300 is disposed to face the GLV 100, with the optical system 200 therebetween. The substrate SB is seated on the top surface of the stage 300, and the stage 300 moves in a scan direction orthogonal to the first direction DR1 and the second direction DR2. The substrate SB may be an object on which a pattern is formed, such as a wafer or glass. Although the stage 300 is described as moving the substrate in the scan direction, the present disclosure is not limited thereto. For example, the stage 300 may remain in place while other elements of the digital exposure device move, or both the stage 300 and the other elements can move, so as to move the substrate in the scan direction.

The control unit 400 controls the operation of the GLV 100. The control unit 400 may apply voltage signal to the first ribbon 110a and the second ribbon 110b. The data modulation unit 500 receives design data from the outside, provides the design data to the GLV 100, or provides modulated data, generated by modulating the design data, to the GLV 100.

Referring to FIG. 2A, the first ribbon 110a and the second ribbon 110b receive first voltage from the control unit 400. The first ribbon 110a and the second ribbon 110b may receive the same voltage, so that they are spaced apart from the metallic substrate 101 by a first distance W1 in the first direction DR1. This position may be referred to as a first position. At this point, the light incident to the first ribbon 110a and the second ribbon 110b is diffracted and causes conductive interference when passing through the Fourier filter 220. Among the light, a light of a zeroth order is delivered to the substrate SB. Since the second light L2 is delivered to the substrate SB, this is called a bright state.

Referring to FIG. 2B, the first ribbon 110a receives the first voltage and the second ribbon 110b receives a second voltage different from the first voltage. The first ribbon 110a is spaced apart from the metallic substrate 120 by the first distance W1 in the first direction DR1, and the second ribbon 110b is spaced apart from the metallic substrate 120 by the second distance W2 in the first direction DR1. The position spaced apart from the metallic substrate 101 by the second distance W2 in the first direction DR1 may be referred to a second position. At this point, the second distance W2 may be set to be greater than the first distance W1. The light incident to the first ribbon 110a and the second ribbon 110b is refracted and causes destructive interference when passing through the Fourier filter 220, so that the light does not reach the substrate SB. Since the second light L2 is not delivered to the substrate SB, this is referred to as a dark state.

Figure 3:
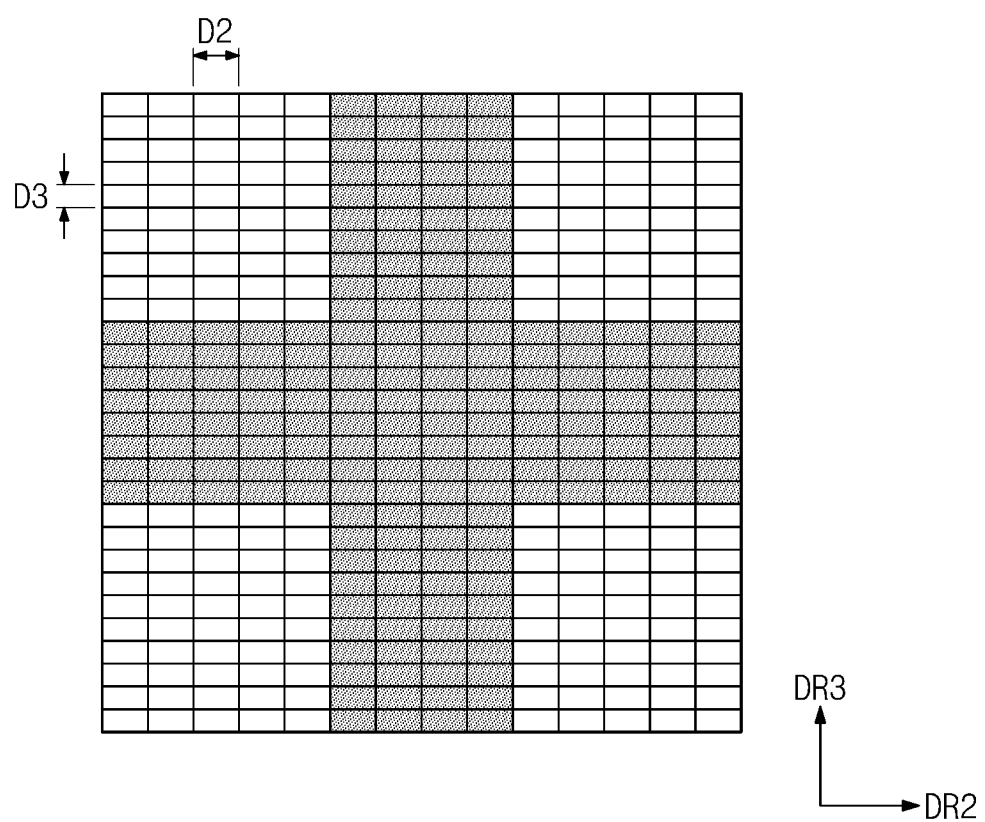
FIG. 3 is a plan view illustrating a substrate with a pattern.

Hereinafter, an operation of the control unit 400 of FIG. 1 will be described. FIG. 3 is a plan view of the substrate SB having a pattern. In FIG. 3, the pattern forms a cross as one example of a possible pattern. Referring to FIG. 3, as mentioned above, when the GLV 100 operates in one of a dark state and a bright state, a pattern to be formed on the substrate SB may be controlled by controlling the second width D2 in the second direction DR2. Hereinafter, the case that the second width D2=0.5 μm will be described.

Hereinafter, a method of using the control unit 400 of FIG. 1 to control a pattern width in the second direction D2 will be described. The control unit 400 divides a gradation range between a dark state and a bright state by m gradation values (m is a natural number), and applies a gradation voltage corresponding to each gradation value to the first ribbon 110a or the second ribbon 110b. This is referred to as a gradation state. Hereinafter, the case that m=5 will be described.

Figure 4:
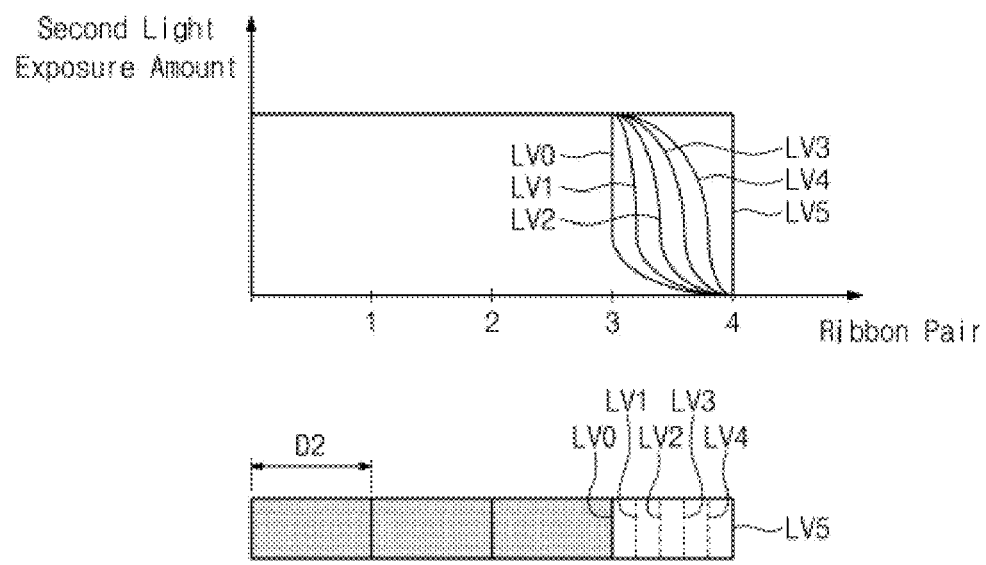
FIG. 4 is a view illustrating an exposure amount of a second light according to four ribbon pairs, and a pattern formed by the exposure amount of the second light.

FIG. 4 is a view illustrating an exposure amount of a second light according to four ribbon pairs and a pattern formed thereby. The left three ribbon pairs operating in a bright state are shown in FIG. 4. In FIG. 4, a gradation level in the dark state is indicated as a zeroth level LV0, and a gradation level in the bright state is indicated as a fifth level LV5. Additionally, a gradation between the zeroth level LV0 and the fifth level LV5 is divided by 5, and a first level to a fourth level LV1 to LV4 are shown.

When the second width D2 is about 0.5 μm, the pattern width of 0.1 μm in the second direction DR2 is formed by the second light corresponding to the first level LV0. The pattern width of 0.2 μm in the second direction DR2 is formed by the second light corresponding to the second level LV2. The pattern width of 0.3 μm in the second direction DR2 is formed by the second light corresponding to the third level LV3. The pattern width of 0.4 μm in the second direction DR2 is formed by the second light corresponding to the fourth level LV4.

Referring to FIGS. 1 and 4, the control unit 400 provides the gradation voltage as a plurality of bits, so as to control m gradation levels of the second light L2. For example, when m is 5, the control unit 400 may provide the gradation voltage as a three-bit signal. That is, the control unit 400 may control the output of the zeroth level LV0 to the fifth level LV5, by using five of eight states controlled by the three-bit signal.

Figure 5:
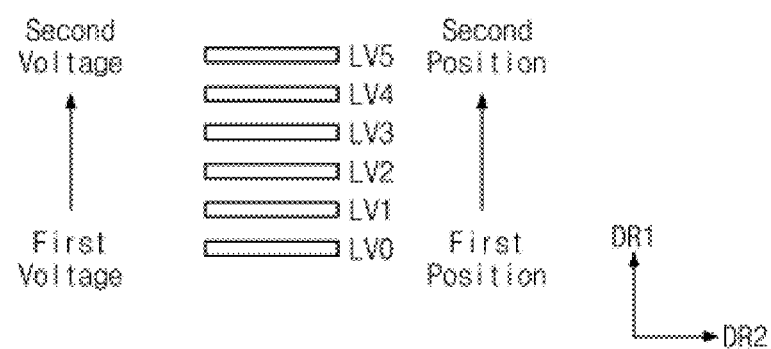
FIG. 5 is a view illustrating the position of a second ribbon according to an applied voltage.

FIG. 5 is a view illustrating the position of a second ribbon according to an applied voltage. The control unit 400 may apply a plurality of different gradation voltage values between the first voltage and the second voltage to the first ribbon 110a and the second ribbon 110b. The gradation voltage values correspond to voltage values corresponding to the first level to fourth level LV1 to LV4.

The second ribbon 110b may move to a position between the first position and the second position corresponding to each of the gradation voltage values. Moreover, the gradation voltage values may not have the same voltage difference. This is because a voltage applied to the second ribbon 110b may not be linearly proportional to the exposure amount of the second light.

Referring to FIG. 3, a pattern to be formed on the substrate SB may be controlled by a third width D3 in the scan direction DR3. The third width D3 is related to a driving frequency of the GLV 100 shown in FIGS. 1, 2A, and 2B. The third width D3 may be the width of the second light L2 in the scan direction DR3 provided during an operating period of the GLV 100. For example, when a driving frequency of the GLV 100 is about 250 KHz, if it takes about 1/250 k sec for the first ribbon 110a or the second ribbon 110b shown in FIGS. 2A and 2B to change its position from the first distance W1 to the second distance W2, the third width D3 may be about 0.25 μm. Since a driving frequency of the GLV 100 cannot be increased indefinitely, there may be a limit to reducing the size of the third width D3.

Figure 6:
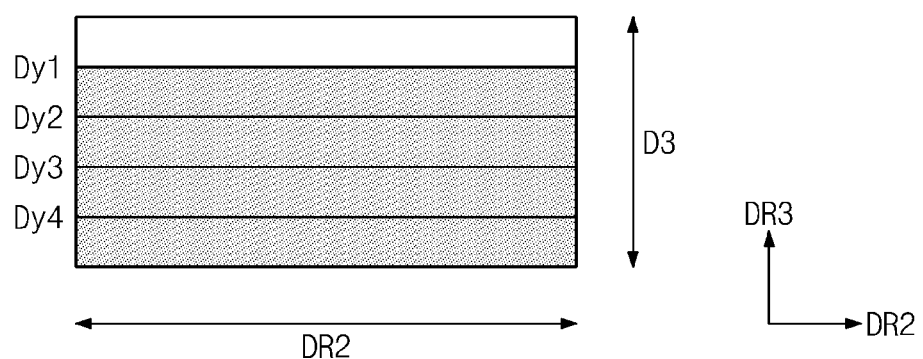
FIG. 6 is a plan view illustrating a unit pattern formed when delay signals are applied.

Hereinafter, a method using the control unit 400 of FIG. 1 to control a pattern width in the scan direction DR3 will be described. FIG. 6 is a plan view illustrating a unit pattern formed when delay signals are applied. Referring to FIGS. 1 and 6, the control unit 400 divides an operating period of the GLV 100 by j (j is a natural number), and provides delay signals dy1 to dy4 to the GLV 100, to delay an operating timing of the GLV 100.

The delay signals dy1 to dy4 may be j−1 signals corresponding to values obtained by equally dividing an operating period of the GLV 100 by j. Hereinafter, the case that j=5 will be described. That is, the delay signals dy1 to dy4 may include a first delay signal to fourth delay signal dy1 to dy4.

When an operating period of the GLV 100 is about 1/250 k sec, the first delay signal Dy1 is a signal that delays an operation of the GLV 100 by about 1/1250 k sec. The second delay signal Dy2 is a signal that delays an operation of the GLV 100 by about 2/1250 k sec. The third delay signal Dy3 is a signal that delays an operation of the GLV 100 by about 3/1250 k sec. The fourth delay signal Dy4 is a signal that delays an operation of the GLV 100 by about 4/1250 k sec.

If the third width D3 is about 0.25 μm, when the first delay signal Dy1 is applied to the GLV 100, the GLV 100 operates in a bright state after about 1/250 k sec, so that a pattern having a width of about 0.20 μm may be formed on the substrate SB in the scan direction DR3. FIG. 6 is a view illustrating a unit pattern formed when the first delay signal Dy1 is applied to the GLV 100

Moreover, when the second delay signal Dy2 is applied to the GLV 100, a pattern having a width of about 0.15 μm may be formed on the substrate SB in the scan direction DR3. When the third delay signal Dy3 is applied to the GLV 100, a pattern having a width of about 0.10 μm may be formed on the substrate SB in the scan direction DR3. When the fourth delay signal Dy4 is applied to the GLV 100, a pattern having a width of about 0.05 μm may be formed on the substrate SB in the scan direction DR3.

Referring to FIGS. 1 and 6, the control unit 400 provides the first to fourth delay signals Dy1 to Dy4 as a plurality of bits. For example, the control unit 400 may provide the first to fourth delay signals Dy1 to Dy4 as a three-bit signal. That is, the control unit 400 may provide the first to fourth delay signals Dy1 to Dy4, by using four of eight states controlled by the three-bit signal.

The digital exposure device 1000 using a GLV according to an exemplary embodiment of the present invention may form a pattern on the substrate SB that is smaller in the second direction DR2 and the scan direction DR3, as compared to a conventional exposure device.

Figure 7:
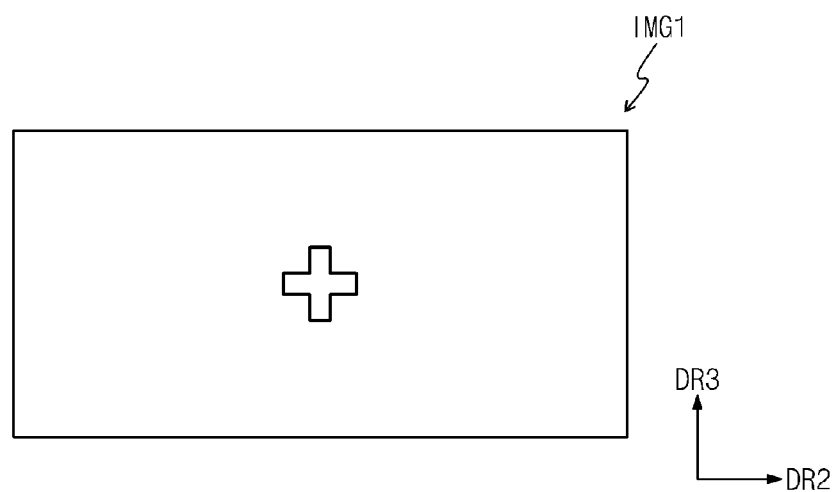
FIG. 7 is a view illustrating an image of design data.
Figure 8:
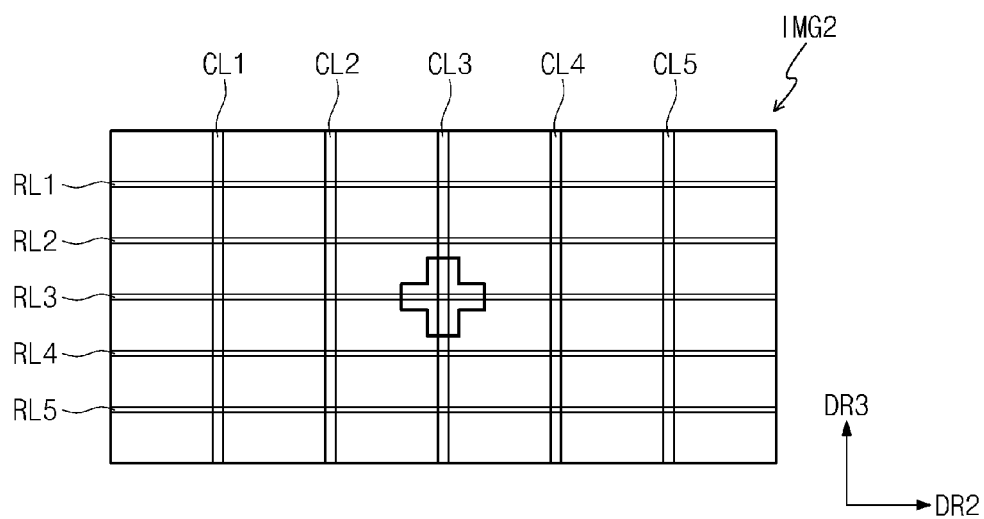
FIG. 8 is a view illustrating an image of modulation data.

Hereinafter, an operation of the data modulation unit of FIG. 1 to generate modulation data will be described. FIG. 7 is a view illustrating an image of design data. FIG. 8 is a view illustrating an image of modulation data. Referring to FIGS. 1, 7, and 8, the design data includes information on a pattern to be formed on the substrate. Moreover, when the substrate SB expands or contracts during a patterning process, the design data should be modulated to correspond to the changes to the substrate SB.

The data modulation unit 500 may generate the modulation data by inserting line data into the design data or deleting line data from the design data. When the data modulation unit 500 inserts the line data into the design data, an image of the design data generally expands, due to the expansion of the substrate SB. Moreover, when the data modulation unit 500 deletes the line data from the design data, an image of the design data generally contracts, due to the contraction of the substrate SB.

As shown in FIG. 8, the image IMG2 of the modulation data is obtained by enlarging an image IMG1 of the design data by the second width D2 in the second direction and by the third width D3 in the scan direction DR3.

The data modulation unit 500 extends in the scan direction, and inserts column line data CL1 to CL5, having a width smaller than the second width D2, into the design data in the second direction. The sum of the widths of the column line data CL1 to CL5 in the second direction DR2 may be the second width D2. For example, when the second width D2 is about 0.5 μm, the column line data CL1 to CL5 may be five, and the width of each of the column line is data CL1 to CL5 in the second direction DR2 may be about 0.1 μm.

Column line data CL1 may be generated based on data adjacent in the second direction DR1. In more detail, the one column line data CL1 may use the left column data thereof or the right column data thereof. Moreover, the one column line data CL1 may be generated by using an average value of the left column data thereof and the right column data thereof.

The column line data CL1 to CL5 may be inserted to equally divide the image IMG1 of the design data in the second direction DR2. However, the present invention is not limited thereto. For example, the insertion position of the column line data CL1 to CL5 may be adjusted in various other ways.

The data modulation unit 500 extends in the second direction DR2 and inserts row line data RL1 to RL5, having a width smaller than the third width D3, to the design data in the scan direction DR3. The sum of the widths of the row line data RL1 to RL5 in the scan direction DR3 may be equal to the third width D3. For example, when the third width D3 is about 0.25 μm, and the width of each of the five row line data RL1 to RL5 in the scan direction DR3 may be about 0.05 μm.

Row line data may be generated based on data adjacent in the scan direction DR3. In more detail, the row line data RL1 may be generated using row data there above or row data there below, as it is. Additionally, the one row line data RL1 may be generated by using an average value of the row data there above or the row data there below.

The row line data RL1 to RL5 may be inserted to equally divide the image IMG1 of the design data in the scan direction DR3. However, the present invention is not limited thereto. The insertion position of the row line data RL1 to RL5 may be variously adjusted.

Figure 9:
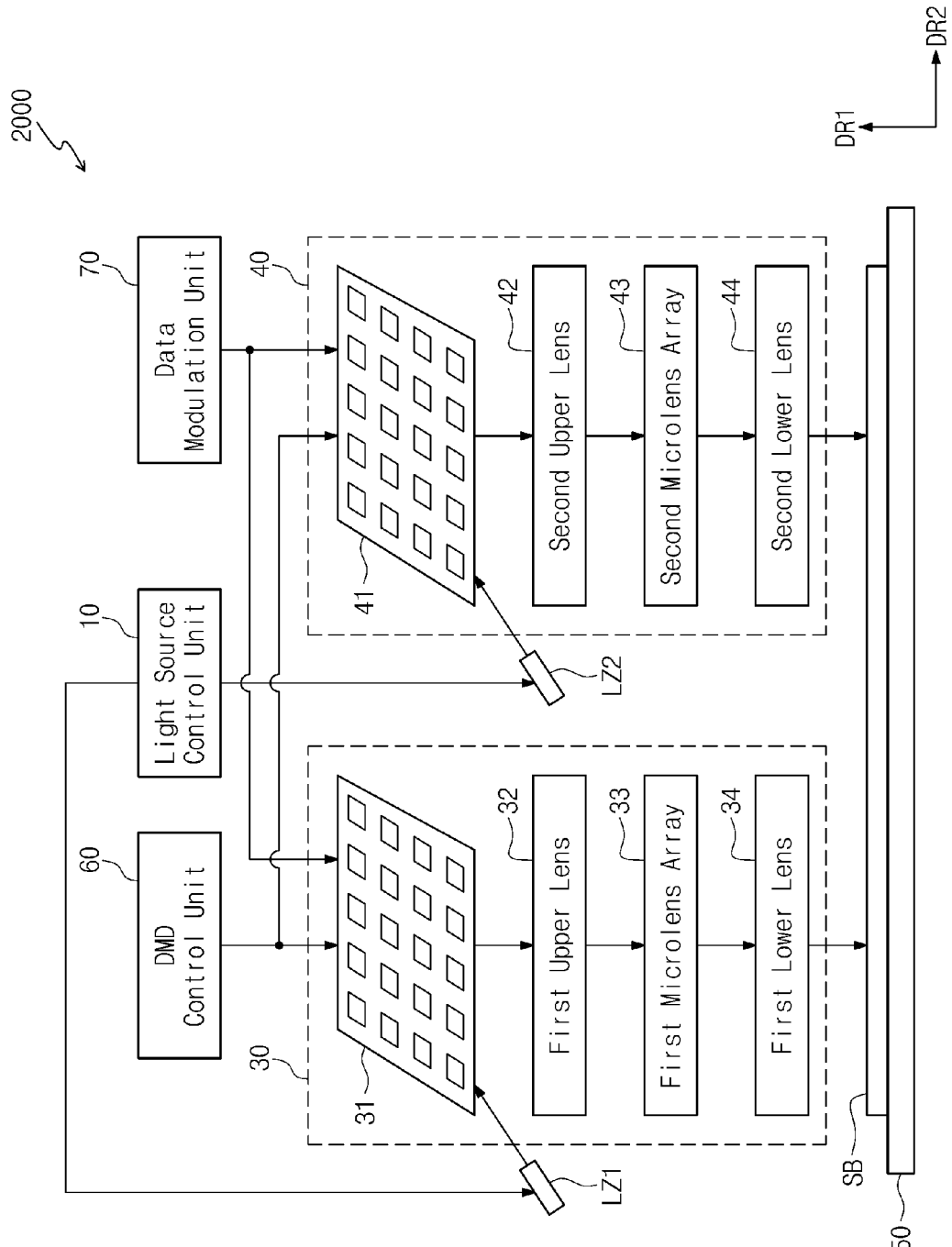
FIG. 9 is a view illustrating a digital exposure device using a DMD, according to an exemplary embodiment of the present invention.

FIG. 9 is a view illustrating a digital exposure device including a digital micro mirror device (DMD), according to an exemplary embodiment of the present invention. Referring to FIG. 9, the digital exposure device 2000 includes a first light source LZ1, a second light source LZ2, a light source control unit 10, a first head 30, a second head 40, a stage 50, a DMD control unit 60, and a data modulation unit 70.

The first light source LZ1 is controlled by the light source control unit 10, so that it provides laser light for exposure to the first head 30. The second light source LZ2 is spaced apart from the first light source LZ1, and is controlled by the light source control unit 10, so that it provides laser light for exposure to the second head 40.

The light source control unit 10 controls the output power of laser light emitted from the first light source LZ1 and the second light source LZ2. According to an exemplary embodiment of the present invention, the light source control unit 10 may control the first light source LZ1 and the second light source LZ2 to have the same output power.

The stage 50 is disposed below the first head 30 and the second head 40 in the first direction DR1. A substrate SB is seated on the top surface of the stage 50. The substrate SB may be an object on which a pattern is formed, such as a wafer or glass.

The stage 50 moves in a scan direction orthogonal to the first direction DR1 and second direction DR2. When the stage 50 moves, the first head 30 and the second head 40 perform a scanning operation across the substrate SB.

The first head 30 modulates laser light provided from the first light source LZ1 and projects the modulated laser light to the substrate SB. The first head 30 includes a first DMD 31, a first upper lens 32, a first micro lens array 33, and a first lower lens 34.

The first DMD 31 includes micro mirrors arranged to adjust an angle of light. Each micro mirror is turned on/off (i.e, is in an off position or an on position), according design data or modulation data provided from the data modulation unit 70, so that each micro mirror selectively reflects laser light provided. When the micro mirror performs an on operation, laser light provided to the first DMD 31 is reflected by the micro mirror and then is provided to the first upper lens 32. When the micro mirror is turned to an off position, a laser light provided to the first DMD 31 is reflected by the micro mirror and not provided to the first upper lens 32. The on position and the off position of the operating micro mirror and the turned-off operating micro mirror may have different angles with respect to a plane parallel to the stage 50. The first upper lens 32, the first micro lens array 33, and the first lower lens 34 are sequentially disposed between the first DMD 31 and the stage 50.

A laser light reflected by a micro mirror in the on position is enlarged while passing through the first upper lens 32. The laser light passing through the first upper lens 32 is converged to a predetermined size while passing through the first micro lens array 33. The resolution of laser light passing through the micro lens array 33 is adjusted and is projected on the substrate SB after passing through the first lower lens 34.

The second head 40, which is spaced apart from the first head 30, modulates a laser light provided from the second light source LZ2 and projects the modulated laser light to the substrate SB. The second head 40 includes a second DMD 41, a second upper lens 42 a second micro lens array 43, and a second lower lens 44.

Since configurations and functions of the second DMD 41, the second upper lens 42, the second micro lens array 43, and the second lower lens 44 substantially correspond to those of the first DMD 31, the first upper lens 32, the first micro lens array 33, and the first lower lens 34, respectively, their detailed descriptions are omitted. Although the first head 30 and the second head 40 are shown as one example in FIG. 9, the present invention is not limited thereto. That is, the number of heads may vary.

The DMD control unit 60 individually turns on/off micro mirrors equipped in the first DMD 31 and the second DMD 41, as discussed below. The data modulation unit 70 receives design data from the outside and provides the received design data to the first DMD 31 and the second DMD 41, or provides modulated data generated by modulating the design data to the first DMD 31 and the second DMD 41.

Figure 10:
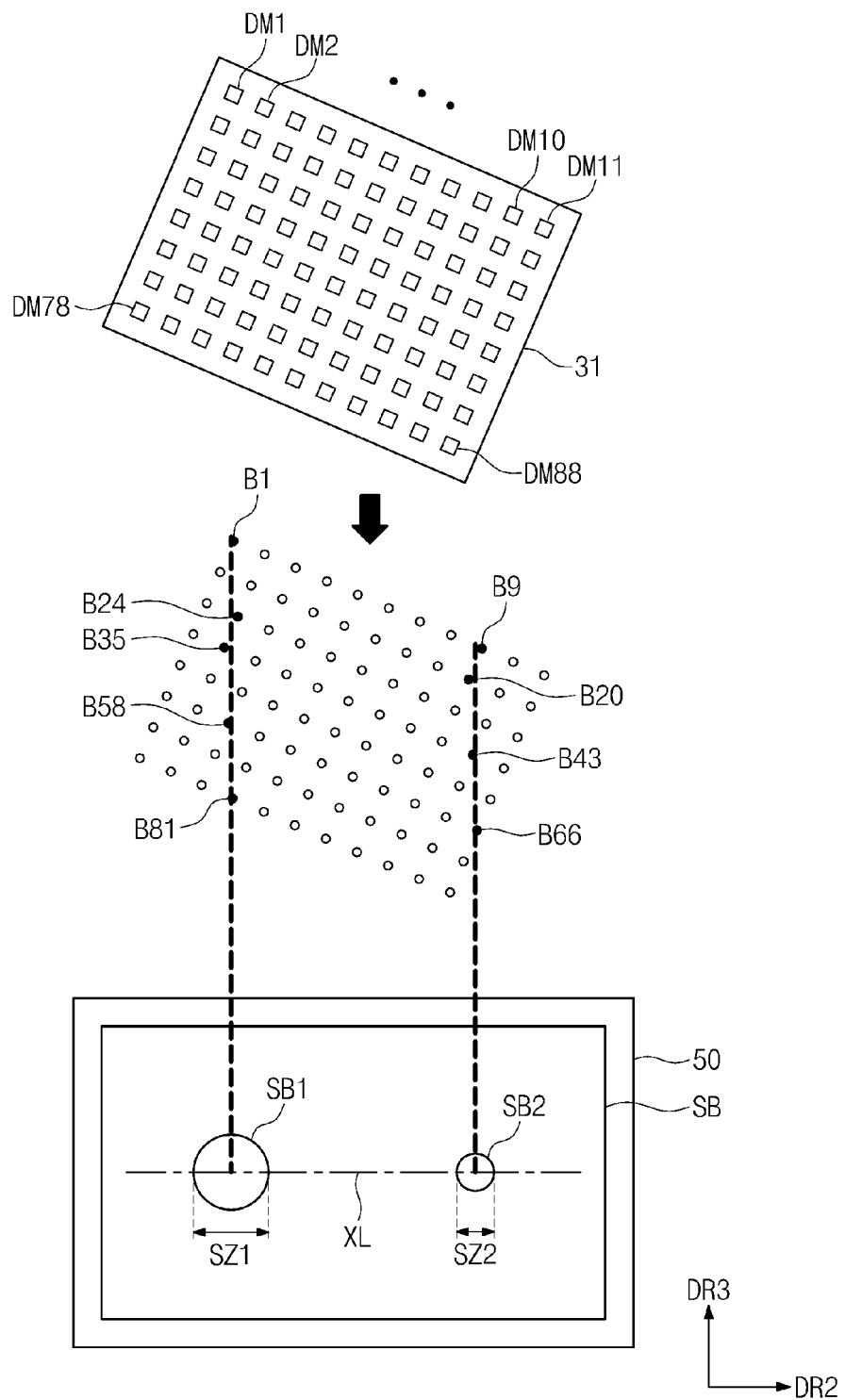
FIG. 10 is a view illustrating a beam spot emitted from a first head of FIG. 9.

FIG. 10 is a view illustrating a beam spot emitted from the first head 30. In FIG. 10, as one example, the first DMD 31 includes 11×8 micro mirrors DM1 to DM88. The micro mirrors DM1 to DM88 all perform an on operation (i.e., are disposed in an on position).

Referring to FIGS. 9 and 10, a laser light incident from the first light source LZ1 is reflected by the first DMD 31, passes through the first upper lens 32, the first micro lens array 33, and the first lower lens 34, and then, is projected to the substrate SB as a plurality of beams B1 to B88. Each of the beams B1 to B88 reflected by a corresponding micro mirror DM1 to DM88 and modulated.

The first DMD 31 may be tilted at a predetermined angle with respect to a plane parallel to the substrate SB. This is to reduce a control width in the second direction DR2, of a pattern to be formed on the substrate SB. Beams overlapping a line parallel to the scan direction DR3 among the beams B1 to B88 pass through the first upper lens 32, the first micro lens array 33, and the first lower lens 34, and then form a beam spot focused on the substrate SB.

In FIG. 10, a first beam spot SB1 formed by the first beam B1, the twenty fourth beam B24, the thirty fifth beam B35, the fifth eighth beam B58, and the eighty first beam B81 and a second beam spot SB2 formed by the ninth beam B9, the twentieth beam B20, the forty third beam B43, and the sixty sixth beam B66 are shown as one example. The first beam spot SB1 and the second beam spot 82 are focused on the same line XL, which is parallel to the second direction DR2, and also simultaneously expose the substrate SB.

The pattern width in the second direction DR2 of a pattern formed on the substrate SB is determined by multiplying the size of the beam spot in the second direction DR2 by the energy of the beam spot. Accordingly, in order to make the pattern width uniform, the multiplication of the size of the beam spot in the second direction DR2 and the energy of the beam spot should be uniformly maintained.

However, as shown in FIG. 10, the size SZ1 of the first beam spot SB1 formed by the first DMD 31 may be different from the size SZ2 of the second beam spot SB2. This may be caused by various factors. For example, since the first DMD 31 expands when heated, it may be misaligned with the first micro lens array 33. As shown In FIG. 10, the size SZ1 of the first beam spot SB1 is larger than the size SZ2 of the second beam spot SB2. Moreover, although not shown in the drawing, due to similar factors, an average size of beam spots formed by the first head 30 may be different from that of beam spots formed by the second head 40.

Moreover, by maintaining a size difference between the first beam spot SB1 and the second beam spot SB2 and setting the energy of the second beam spot SB2 to be greater than the energy of the first beam spot SB1, the pattern width in the second direction DR2, which is formed by the first beam spot SB1 and the second beam spot SB2, may be uniformly controlled. Such a method may be effective for removing an exposed portion by using a positive photoresist during pattern formation. However, if an exposed portion remains when using a negative photoresist during pattern formation, due to an energy difference between the first beam spot SB1 and the second beam spot SB2, there is a difference in exposure amount. As a result, the top surface of the remaining photoresist pattern may not be parallel to the substrate SB. That is, the pattern formed on the substrate SB may not have a uniform thickness.

Figure 11:
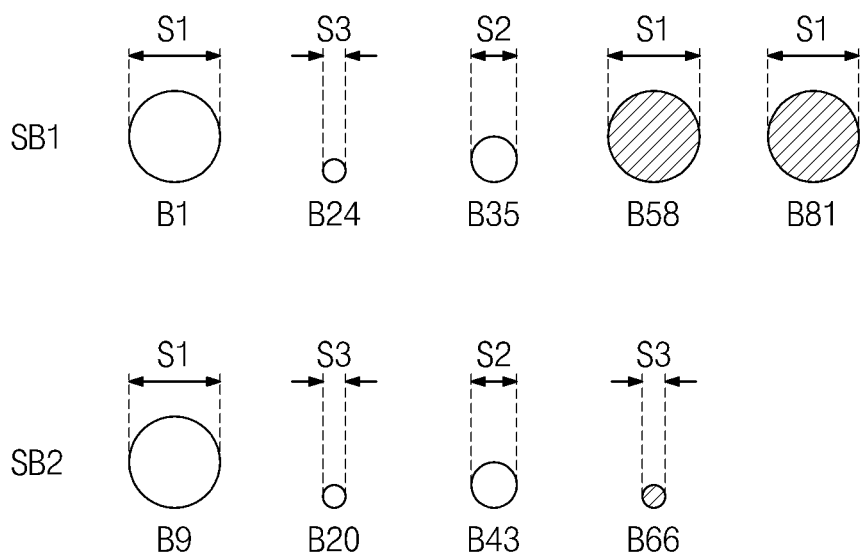
FIG. 11 is a view illustrating an operation of a DMD control unit of FIG. 9.

FIG. 11 is a view illustrating an operation of the DMD control unit of FIG. 9. Referring to FIGS. 9 to 11, the DMD control unit 60 controls the sizes of the beam spots generated by the first head 30 to be a first average size. The DMD control unit 60 controls the sizes of the beam spots to be a second average size. At this point, the first average size and the second average size may be different from each other. Additionally, the DMD control unit 60 controls the energies of the beam spots generated by the first head 30 and the second head 40 to be the same.

Hereinafter, the case that the DMD control unit 60 controls the sizes of the beam spots generated by the first head 30 to be the first average size will be described. Since the DMD control unit 60 controls the second head 40 in a similar manner, the description thereof is omitted. At least one of the first beam B1, the twenty fourth beam B24, the thirty fifth beam B35, the fifth eighth beam B58, and the eighty first beam B81 constituting the first beam spot SB1 may have a different size from the others. In FIG. 11, the first beam B1, the fifth eighth beam B58, and the eighty first beam B81 have a first size S1. The thirty fifth beam B35 has a second size S2. The twenty fourth beam B24 has a third size S3.

Additionally, the ninth beam B9, the twentieth beam B20, the forty third beam B43, and the sixty sixth beam B66 may have different sizes. In FIG. 11, the ninth beam B9 has the first size S1. The forty third beam B43 has the second size. The twentieth beam B20 and the sixty sixth beam B66 have the third size.

At this point, S1>S2>S3 is established between the first to third sizes S1 to S3. The first average size is an average size of entire beam spots formed by the first DMD 31. According to an exemplary embodiment of the present invention, the first average size is the second size S2.

The DMD control unit 60 selectively turns on the micro mirrors corresponding to some beams having the first average size, and turns off the remaining micro mirrors. The DMD control unit 60 controls the same number of micro mirrors performing an on operation to provide beams constituting the first beam spot SB1, and micro mirrors performing an on operation to provide beams constituting the second beam spot SB2.

According to an embodiment of the present invention, the DMD control unit 60 turns off two of the first micro mirror DM1, the fifty eighth mirror DM58, and the eighty first micro mirror DM81 among the first micro mirror DM1, the twenty fourth micro mirror DM24, the thirty fifth micro mirror DM35, the fifty eighth mirror DM58, and the eighty first micro mirror DM81, and also turns on the remaining micro mirror. The case where the DMD control unit 60 turns on the first micro mirror DM1, the twenty fourth micro mirror DM24, and the thirty fifth micro mirror DM35 will be described.

The first beam spot SB1 is formed from the first beam B1, the twenty fourth beam B24, and the thirty fifth beam B35, and an average size of the first beam B1, the twenty fourth beam B24, and the thirty fifth beam B35 becomes the second size S2.

Moreover, the DMD control unit 60 turns off one of the twentieth micro mirror DM20 and the sixty sixth micro mirror DM66 among the ninth micro mirror DM9, the twentieth micro mirror DM20, the forty third micro mirror DM43, and the sixty sixth micro mirror DM 66, and turns on the remaining one. The case where the DMD control unit 60 turns on the ninth micro mirror DM9, the twentieth micro mirror DM20, and the forth third micro mirror DM43 will be described.

The second beam spot SB2 is formed from the ninth micro mirror DM9, the twentieth micro mirror DM20, and the forth third micro mirror DM43, and an average size of the ninth micro mirror DM9, the twentieth micro mirror DM20, and the forth third micro mirror DM43 becomes the second size S2.

That is, the size of the first beam spot SB1 becomes identical to the size of the second beam spot SB2, due to the DMD control unit 60. Additionally, the number of beams constituting the first beam spot SB1 is identical to the number of beams constituting the second beam spot SB2. Through such a method, the DMD control unit 60 controls the sizes of beam spots to be an average size, and also controls the energies of the beam spots to be identical.

Figure 12:
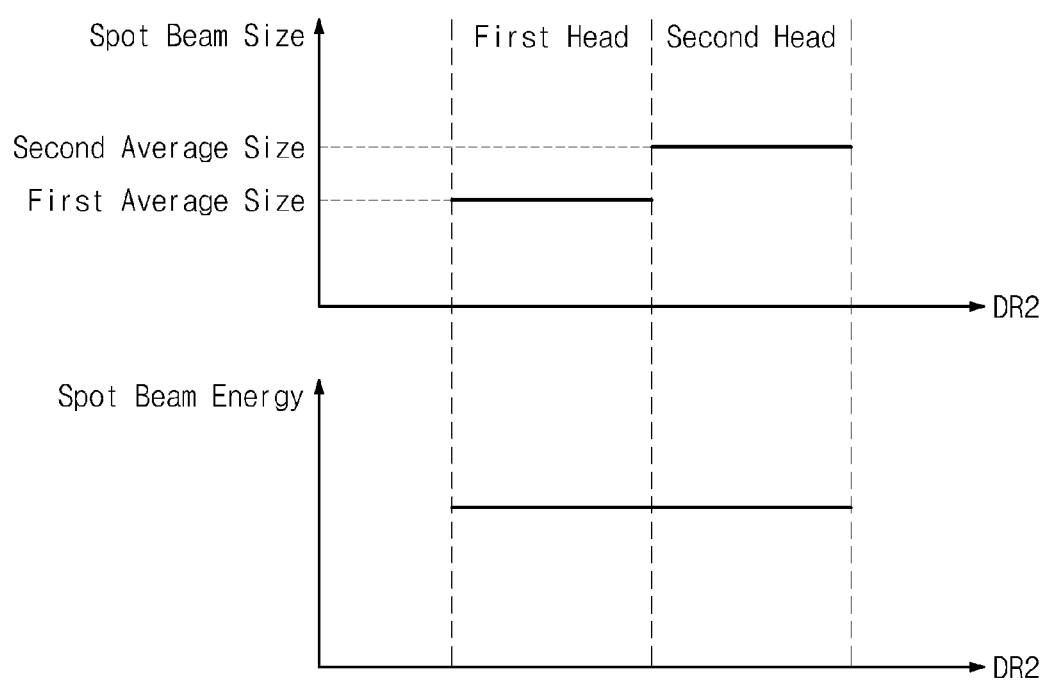
FIG. 12 is a view illustrating a beam spot size and a beam spot energy, according to the second direction of each head.

FIG. 12 is a view illustrating a beam spot size and a beam spot energy according to the second direction DR2 of each head. Referring to FIGS. 9, 10, and 12, the DMD control unit 60 controls the sizes of beam spots emitted from the first head 30 along the second direction DR2 to be the first average size. Moreover, the DMD control unit 60 controls the sizes of beam spots emitted from the second head 40 along the second direction DR2 to be the second average size. At this point, the first average size and the second average size may be different from each other. This is because the DMD control unit 60 controls the sizes of beam spots from each head independently, and the beams emitted from the first head 30 and the beams emitted from the second head 40 have different sizes.

Moreover, the DMD control unit 60 controls the energy of beam spots generated by the first head 30 and the energy of beam spots generated by the second head 40 to be the same. For example, when the DMD control unit 60 controls the beam spots of the first head 30 to be generated by three beams, the beam spots of the second head 40 should be generated by three beams.

In order to compensate for a size difference between the beam spots of the first head 30 and the second head 40, the data modulation unit 70 may set a design pattern width differently in the second direction DR2, of design data provided to the first DMD 31 and the second DMD 41. Here, the design pattern width means a design value corresponding to the width of a pattern to be formed on the substrate SB.

The design data includes first design data corresponding to the first DMD 31 and second design data corresponding to the second DMD 41. The data modulation unit 70 modulates the first design data to generate first modulation data, and modulates the second design data to generate second modulation data.

For convenience of description, the first design data and the first modulation data have the same design pattern width, and the second design data and the second modulation data have different design pattern widths. A case in which the data modulation unit 70 selectively modulates the design pattern width of the second design data will be described below.

Figure 13:
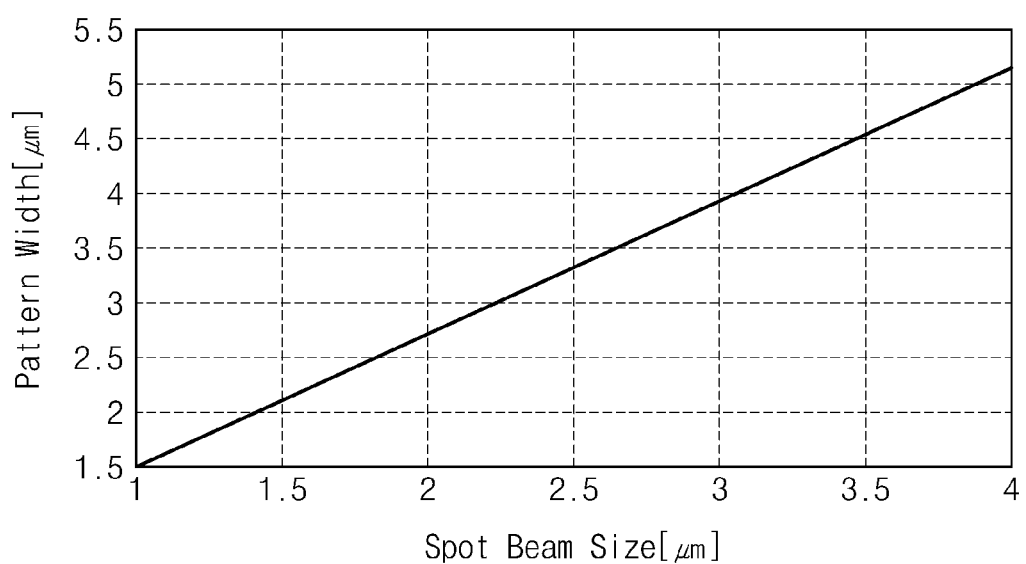
FIG. 13 is a view illustrating a pattern width according to the size of a beam spot.

FIG. 13 is a view illustrating a pattern width according to the size of beam spot. Referring to FIG. 13, the pattern width is proportional to the size of beam spot with a slope of about 0.85.

Referring to FIGS. 12 and 13, since the second average size is greater than the first average size, the data modulation unit 70 modulates the design pattern width of the second modulation data to be smaller than the design pattern width of the second design data, by a pattern bias. At this point, a relationship between an average size difference of a beam spot from each head and a pattern bias is expressed as the following equation.

$$\Delta CD = \Delta S / 0.85 \qquad \text{[Equation]}$$

Here, $\Delta CD$ is a pattern bias and $\Delta S$ is an average size difference of a beam spot from each head.

As mentioned above, in order to form a uniform pattern width for each head, a design pattern width provided to the second DMD 41 is reduced, but the present invention is not limited thereto. That is, a design pattern width provided to the first DMD 31 may be increased. Furthermore, a portion of the design width of a design pattern provided to the first DMD 31 may be increased and a portion of the design width of a design pattern provided to the second DMD 41 may be reduced.

In relation to a digital exposure device using a DMD, according to an exemplary embodiment of the present invention, by providing a difference in a design pattern width for each head, a size difference of a beam spot of each head is compensated for. As a result, the width of a pattern to be formed on a substrate is uniformly maintained for each head. Additionally, by uniformly maintaining the pattern width for each head and the energy of a beam spot for each head, even when a negative photoresist is used, a pattern to be formed on a substrate may have a uniform thickness.

Figure 14:
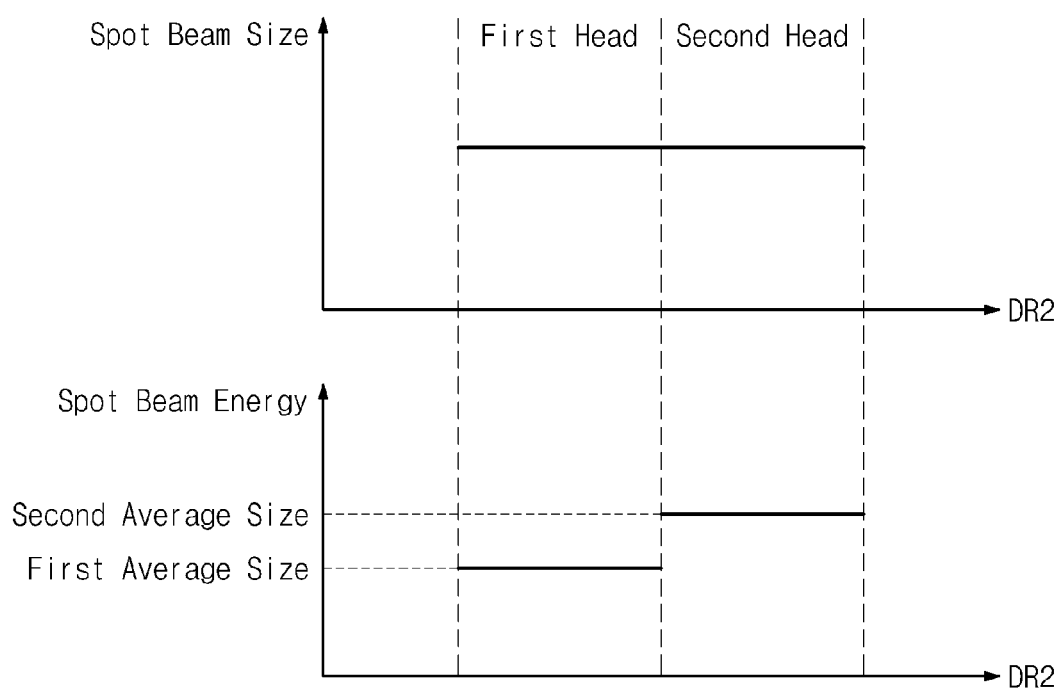
FIG. 14 is a view illustrating a beam spot size and a beam spot energy, along the second direction of each head in a digital exposure device including a DMD, according to another exemplary embodiment of the present invention.

FIG. 14 is a view illustrating a beam spot size and a beam spot energy along the second direction of each head in a digital exposure device using a DMD according to another exemplary embodiment of the present invention. In comparison to the digital exposure device using a DMD of FIG. 9, the control unit 10, the DMD control unit 60, and the data modulation unit 70 of FIG. 14 are different from the control unit 10, the DMD control unit 60, and the data modulation unit 70 of FIG. 9, but the remaining features are substantially the same. Hereinafter, only the difference will be mainly described, and repeated descriptions are omitted.

Referring to FIGS. 9 and 14, the DMD control unit 60 controls the beam spots is formed by the first head 30 and the second head 40 to be the same average size. Moreover, the DMD control unit 60 controls the energy of beam spots of the first head 30 to be a first average energy and controls the energy of beam spots of the second head 40 to be a second average energy. At this point, the first average and the second average may be different from each other.

According to an exemplary embodiment of the present invention, since the energy of beam spots of each head is controlled using the same value, the sizes of beam spots of each head may be different. According to another embodiment of the present invention, since an average size of beam spots of each head is controlled identically, the energy of beam spots of each head may be different.

In order to compensate for an energy difference between the beam spots of the first head 30 and the second head 40, the light source control unit 10 may differently control the output of laser light emitted from the first light source LZ1 and the second light source LZ2.

In FIG. 14, since the second average energy is greater than the first average energy, the light source control unit 10 may control the output of a laser light emitted from the first light source LZ1 to be greater than the output of a laser emitted from the second light source LZ2.

In relation to a digital exposure device using a DMD according to another exemplary embodiment of the present invention, by providing a difference in an output of a laser light from each light source, an energy difference of a beam spot for each head is compensated for. As a result, this embodiment may achieve the same effects as the above embodiment.

According to a digital exposure device using a GLV, resolution is improved, so that the size of a pattern to be formed on a substrate may be formed smaller than before in a scan direction and a direction vertical to the scan direction.

According to a digital exposure device using a DMD, even when a negative photoresist is used, a uniform pattern width and thickness of each head may be formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A digital exposure device comprising:
   a stage configured to support a substrate;
   a grating light valve (GLV) comprising a first ribbon and a second ribbon that are spaced apart from the stage in a first direction and extend in a scan direction, the first ribbon and the second ribbon together as a pair are configured to diffract light;
   an optical system disposed between the stage and the GLV in the first direction, and configured to filter and focus the diffracted light, so as to form a pattern on the substrate; and
   a control unit configured to:
   control a width of the pattern, taken in a second direction orthogonal to the scan direction, by a unit obtained by dividing the second direction width of the pattern by a natural number m;
   control a width of the pattern, taken in the scan direction, by a unit obtained by dividing the scan direction width of the pattern by a natural number i;
   operate the GLV in a bright state by applying the same voltage to the first ribbon and the second ribbon;
   operate the GLV in a dark state by applying different voltages to the first ribbon and the second ribbon; and
   operate the GLV in a gradation state by applying a gradation voltage to the second ribbon, the gradation voltage corresponding to a gradation value produced by dividing a gradation range between the dark state and the bright state by m,
   wherein:
   the second direction width of the pattern is associated with a sum of a width of the first ribbon and the second ribbon in the second direction;
   the second direction width of the pattern and the scan direction width of the pattern are determined by an exposure amount of the diffracted light during a first time, the first time is constant in each of the bright state and the gradation state, and the first time is determined by dividing an operating period of the GLV by i and delaying an operating timing of the GLV; and
   the diffracted light diffracted by the first ribbon and the second ribbon is configured to be incident onto a first lens of the optical system in the bright state, the gradation state, and the dark state.

2. The device of claim 1, wherein:
   the GLV further comprises a metallic substrate; and
   at least a portion of the first ribbon and at least a portion of the second ribbon is spaced apart from the metallic substrate in the first direction.

3. The device of claim 2, wherein the control unit is further configured such that:
   a first voltage is applied to the first ribbon and the second ribbon in the bright state;
   the first voltage is applied to the first ribbon and a second voltage different from the first voltage is applied to the second ribbon, in the dark state; and
   the first voltage is applied to the first ribbon and the gradation voltage is applied to the second ribbon, in the gradation state.

4. The device of claim 3, wherein:
   the second ribbon is spaced apart from the metallic substrate in the first direction by a first distance, in the bright state;
   the second ribbon is spaced apart from the metallic substrate in the first direction by a second distance different from the first distance, in the dark state; and
   the second ribbon is spaced apart from the metallic substrate in the first direction by a third distance between the first distance and the second distance, in the gradation state.

5. The device of claim 1, wherein the optical system comprises:
   the first lens to focus the diffracted light;
   a Fourier filter to selectively filter or block the light focused by the first lens; and
   a second lens configured to focus the filtered light into the pattern formed on substrate.

6. The device of claim 1, wherein m and j are 5.

7. The device of claim 1, wherein the control unit is further configured to provide delay signals to the GLV to delay the operating timing of the GLV.

8. The device of claim 1, further comprising a data modulation unit configured to convert received design data into modulation data provided to the GLV.

9. The device of claim 8, wherein the data modulation unit is configured to insert or delete at least one of column line data and row line data into or from the design data to obtain the modulation data.

10. The device of claim 9, wherein the data modulation unit is configured to divide the second direction width of the pattern by a natural number m, to obtain the second direction width of the column line data.

11. The device of claim 9, wherein the data modulation unit is configured to divide the scan direction width of the pattern by a natural number j, during the operating period of the GLV, to obtain the scan direction width of the row line data.

12. The device of claim 9, wherein the data modulation unit is configured to generate the column line data based on data adjacent in the second direction, and generate the row line data based on data adjacent in the scan direction.

* * * * *